(12) United States Patent
Koyanagi (10) Patent No.: US 7,330,865 B2
(45) Date of Patent: Feb. 12, 2008

(54) DIGITAL FILTER AND ITS DESIGNING METHOD

(75) Inventor: Yukio Koyanagi, Saitama (JP)

(73) Assignee: Neuro Solution Corp., Tokyo (JP)

( * ) Notice: Subject to any disclaimer, the term of this patent is extended or adjusted under 35 U.S.C. 154(b) by 719 days.

(21) Appl. No.: 10/708,405

(22) Filed: Mar. 1, 2004

(65) Prior Publication Data

US 2004/0172434 A1    Sep. 2, 2004

Related U.S. Application Data

(63) Continuation of application No. PCT/JP02/09046, filed on Sep. 5, 2002.

(30) Foreign Application Priority Data

Sep. 10, 2001   (JP)   ............................ 2001-273345

(51) Int. Cl.
*G06F 17/10* (2006.01)
(52) U.S. Cl. .................................................. 708/319
(58) Field of Classification Search ................. 708/319
See application file for complete search history.

(56) References Cited

U.S. PATENT DOCUMENTS

| | | | | |
|---|---|---|---|---|
| 4,542,475 A | * | 9/1985 | Acampora | .................. 708/319 |
| 5,757,683 A | * | 5/1998 | Deczky | ....................... 708/319 |
| 5,928,314 A | * | 7/1999 | Pelgrom et al. | ............. 708/319 |
| 6,662,200 B2 | * | 12/2003 | Acharya | ..................... 708/319 |
| 6,718,354 B1 | * | 4/2004 | Mou | .......................... 708/313 |

FOREIGN PATENT DOCUMENTS

| | | |
|---|---|---|
| JP | 61-049516 | 3/1986 |
| JP | 05-243908 | 9/1993 |
| JP | 6-326555 | 11/1994 |

\* cited by examiner

*Primary Examiner*—Tan V. Mai
(74) *Attorney, Agent, or Firm*—Connolly Bove Lodge and Hutz

(57) ABSTRACT

A method for designing a digital filter for outputting a signal that is the sum of the products of multiplication of the signals at the taps of delay units (11-16) by the filter factors given by factor units (21-25), several times of the signals, wherein various filters from a low-pass filter to a high-pass filter can be designed by using, as the filter factors, the terms of a symmetrical sequence, e.g., $\{-1, 0, 9, 16, 9, 0, -1\}$ in which the sum of all the terms is not zero, and the sum of every other terms is equal to the sum of the other every other terms and has the same sign of that of the other every other terms and by simply changing the signs of the terms of the sequence. By applying a combination of cascade connection of filters, conversion of clock rate, and transfer of filter factors, a digital filter having desired frequency characteristics can be extremely simply designed.

14 Claims, 11 Drawing Sheets

| [1] | | [2] | | [3] | | [4] |
|---|---|---|---|---|---|---|
| −1 | | −1 | | −1 | | −1 |
| 3 | −1 | 2 | −1 | 1 | −1 | 0 |
| 3 | 3 | 6 | 2 | 8 | 1 | 9 |
| −1 | 3 | 2 | 6 | 8 | 8 | 16 |
| | −1 | −1 | 2 | 1 | 8 | 9 |
| | | | −1 | −1 | 1 | 0 |
| | | | | | −1 | −1 |

| | FIRST-ORDER C1 | SECOND-ORDER C2 | FOURTH-ORDER C3 |
|---|---|---|---|
| R1 | −0.031 | | |
| R2 | 0 | | |
| R3 | 0.281 | 0.001 | |
| R4 | 0.5 | 0 | |
| R5 | 0.281 | −0.018 | |
| R6 | 0 | −0.031 | |
| R7 | −0.031 | 0.062 | 0 |
| R8 | | 0.281 | 0 |
| R9 | | 0.41 | 0 |
| R10 | | 0.281 | 0 |
| R11 | | 0.062 | 0 |
| R12 | | −0.031 | 0.002 |
| R13 | | −0.018 | 0 |
| R14 | | 0 | −0.013 |
| R15 | | 0.001 | −0.028 |
| R16 | | | −0.001 |
| R17 | | | 0.109 |
| R18 | | | 0.263 |
| R19 | | | 0.337 |
| R20 | | | 0.263 |
| R21 | | | 0.109 |
| R22 | | | −0.001 |
| R23 | | | −0.028 |
| R24 | | | −0.013 |
| R25 | | | 0 |
| R26 | | | 0.002 |
| R27 | | | 0 |
| R28 | | | 0 |
| R29 | | | 0 |
| R30 | | | 0 |
| R31 | | | 0 |

| LPF1(4) |  | HPF1(4) |
|---|---|---|
| 0.002 | −0.002= | +0.002 |
| 0 |  | 0 |
| −0.013 |  | 0.013 |
| −0.028 |  | 0.028 |
| −0.001 |  | 0.001 |
| 0.109 |  | −0.109 |
| 0.263 |  | −0.263 |
| 0.337 | 1−0.337= | 0.663 |
| 0.263 |  | −0.263 |
| 0.109 |  | −0.109 |
| −0.001 |  | 0.001 |
| −0.028 |  | 0.028 |
| −0.013 |  | 0.013 |
| 0 |  | 0 |
| 0.002 |  | −0.002 |

| COMBINED FACTOR | TRANSFER FACTOR |
|---|---|
| −0.001 | 0.001 |
| 0.001 | −0.001 |
| −0.001 | 0.001 |
| 0.001 | −0.001 |
| 0 | 0 |
| −0.002 | 0.002 |
| 0.005 | −0.005 |
| −0.008 | 0.008 |
| 0.011 | −0.011 |
| −0.012 | 0.012 |
| 0.01 | −0.01 |
| −0.004 | 0.004 |
| −0.008 | 0.008 |
| 0.025 | −0.025 |
| −0.046 | 0.046 |
| 0.07 | −0.07 |
| −0.094 | 0.094 |
| 0.113 | −0.113 |
| −0.127 | 0.127 |
| 0.131 | 0.869 |
| −0.127 | 0.127 |
| 0.113 | −0.113 |
| −0.094 | 0.094 |
| 0.07 | −0.07 |
| −0.046 | 0.046 |
| 0.025 | −0.025 |
| −0.008 | 0.008 |
| −0.004 | 0.004 |
| 0.01 | −0.01 |
| −0.012 | 0.012 |
| 0.011 | −0.011 |
| −0.008 | 0.008 |
| 0.005 | −0.005 |
| −0.002 | 0.002 |
| 0 | 0 |
| 0.001 | −0.001 |
| −0.001 | 0.001 |
| 0.001 | −0.001 |
| −0.001 | 0.001 |

TARGET CUT-OFF FREQUENCY

FIG. 18B

TARGET CUT-OFF FREQUENCY

FIG. 18C

TARGET CUT-OFF FREQUENCY

DIGITAL FILTER AND ITS DESIGNING METHOD

CROSS REFERENCE TO RELATED APPLICATIONS

This Application is a Continuation of application PCT/JP02/09046 filed on Sep. 5, 2002, the entire contents of which are incorporated herein by reference. PCT/JP02/09046 claims priority to Japanese application 2001-273345 filed on Sep. 10, 2001.

BACKGROUND OF THE INVENTION

1. Field of the Invention

The present invention relates to a digital filter and its designing method and is particularly suitable for an FIR filter, which comprises a tapped delay line made up of a plurality of delay units and performs addition and output after multiplying the signals of taps by several times.

2. Description of the Related Art

Some kind of digital signal processing is generally performed in various kinds of electronic devices provided in different fields of communication, measurement, sound/image signal processing, medical care, seismology, and so on. The most significant basic operation of the digital signal processing is filtering which extracts only a signal having a necessary frequency band from mixed input signals of various signals and noise. Thus, digital filters are frequently used in electronic devices for performing digital signal processing.

An IIR (Infinite Impulse Response) filter and an FIR (Finite Impulse Response) filter are frequently used as a digital filter. The FIR filter has the following advantages: first, since the transfer factor of the FIR filter has a pole only on the origin of the z-plane, a circuit is always stable, and second, linear phase characteristics are achieved with complete accuracy.

When filters are classified based on the arrangement of a pass band and a stop band, filters are divided into four of a low-pass filter, a high-pass filter, a bandpass filter, and a band-stop filter. The low-pass filter is basically used for the IIR filter and the FIR filter. The other high-pass filter, bandpass filter, and band-stop filter are derived from the low-pass filter by performing processing such as frequency conversion.

In some applications of electronic devices, symmetrical FIR filters are used. The symmetrical FIR filter is composed of a pair of a low-pass filter and a high-pass filter that have symmetrical frequency characteristics. In such a symmetrical FIR filter, a basic low-pass filter is first designed and frequency conversion is performed thereon, so that a high-pass filter is designed with characteristics symmetrical to those of the low-pass filter.

Incidentally in the FIR filter, an impulse response represented by a finite time length acts as a filter factor as it is. Therefore, designing the FIR filter is to determine filter factors to obtain desired frequency characteristics.

Conventionally in frequency conversion for deriving filter factors of a high-pass filter and so forth from an FIR low-pass filter, the cut-off frequency of the filter is converted. To be specific, convolution or the like using a window function, Chebyshev approximation, and so forth is performed based on a ratio of a sampling frequency and a cut-off frequency, so that the transfer factor of the filter is determined. The transfer factor is further converted into a frequency component.

However, in the frequency conversion using a window function, Chebyshev approximation, and so forth, calculation is extremely complicated. Thus, calculation performed by software increases a processing load and calculation performed by hardware increases a circuit size.

Further, the frequency characteristics of a filter that are obtained by conventional design methods depend upon a window function and approximation. Thus, when the window function and approximation are not properly set, excellent frequency characteristics cannot be obtained. However, it is generally difficult to properly set a window function and approximation and thus it is quite demanding to design a filter with desired frequency characteristics.

Moreover, a method of directly determining a filter factor of a high-pass filter and so forth regardless of frequency conversion is also available. However, in this case, filter factors required for desired frequency characteristics have to be determined by trial and error, so that a design cannot be made with ease.

The present invention is devised to solve the above-described problems. An object of the present invention is to readily design an FIR digital filter having desired frequency characteristics.

SUMMARY OF THE INVENTION

A digital filter of the present invention, comprising a tapped delay line made up of a plurality of delay units, the digital filter multiplying the signals of taps by given filter factors and then performing addition and output, characterized in that the filter factors have a symmetrical sequence and values of the filter factors are set so that the sum of the sequence is not zero and the sum of every other terms is equal to the sum of the other every other terms with the same signs.

For example, the sequence of filter factors satisfying the conditions is composed of ratios of −1, 0, 9, 16, 9, 0, and −1.

Such a digital filter may be cascaded in a plurality of stages.

According to another aspect of the present invention, a digital filter, comprising a tapped delay line made up of a plurality of delay units, the digital filter multiplying the signals of taps by given filter factors and then performing addition and output, characterized in that the filter factors have a symmetrical sequence and values of the filter factors are set so that the sum of the sequence is zero and the sum of every other terms is equal to the sum of the other every other terms with opposite signs.

For example, the sequence of filter factors satisfying the conditions is composed of ratios of 1, 0, −9, 16, −9, 0, and 1.

Such a digital filter may be cascaded in a plurality of stages.

According to another aspect of the present invention, a digital filter, comprising a tapped delay line made up of a plurality of delay units, the digital filter multiplying the signals of taps by given filter factors and then performing addition and output, characterized in that the filter is designed based on first filter factors having a symmetrical sequence in which values are set so that the sum is not zero and the sum of every other terms is equal to the sum of the other every other terms with the same signs, and second filter factors are provided as filter factors for the signals of the taps, the second filter factors having a sequence in which values are set so that the sums of the first filter factors and the second filter factors serve as reference values.

According to another aspect of the present invention, a digital filter, comprising a tapped delay line made up of a plurality of delay units, the digital filter multiplying the signals of taps by given filter factors and then performing addition and output, characterized in that the filter is designed based on second filter factors having a symmetrical sequence in which the sum is zero and the sum of every other terms is equal to the sum of the other every other terms with opposite signs, and first filter factors are provided as filter factors for the signals of the taps, the first filter factors having a sequence in which values are set so that the sums of the second filter factors and the first filter factors serve as reference values.

Further, a method of designing a digital filter according to the present invention, the digital filter comprising a tapped delay line made up of a plurality of delay units, the digital filter multiplying the signals of taps by given filter factors and then performing addition and output, characterized in that the method comprises determining filter factors for the signals of the taps by reversing the signs of values other than the median of the sequence of basic filter factors while causing the absolute values of the sequence to remain the same based on the basic filter factors having a symmetrical sequence in which values are set so that the sum is not zero and the sum of every other terms is equal to the sum of the other every other terms with the same signs.

According to another aspect of the present invention, a method of designing a digital filter, the digital filter comprising a tapped delay line made up of a plurality of delay units, the digital filter multiplying the signals of taps by given filter factors and then performing addition and output, characterized in that the method comprises determining filter factors for the signals of the taps by reversing the signs of values other than the median of the sequence of basic filter factors while causing the absolute values of the sequence to remain the same, and subtracting the median of the sequence from the reference value, based on the basic filter factors having a symmetrical sequence in which values are set so that the sum is not zero and the sum of every other terms is equal to the sum of the other every other terms with the same signs.

Another aspect of the present invention is characterized in that filter factors for the signals of the taps are determined by performing the same operation based on basic filter factors having a symmetrical sequence in which values are set so that the sum is zero and the sum of every other terms is equal to the sum of the other every other terms with opposite signs.

According to another aspect of the present invention, a method of designing a digital filter, the digital filter comprising a tapped delay line made up of a plurality of delay units, the digital filter multiplying the signals of taps by given filter factors and then performing addition and output, characterized in that the method comprises determining, based on basic filter factors having a symmetrical sequence in which values are set so that the sum is not zero and the sum of every other terms is equal to the sum of the other every other terms with the same signs, filter factors for the signals of the taps by converting the sequence of the basic filter factors and setting values so that the sum of the converted sequence is zero and the sum of every other terms is equal to the sum of the other every other terms with opposite signs in the converted sequence.

According to another aspect of the present invention, a method of designing a digital filter, the digital filter comprising a tapped delay line made up of a plurality of delay units, the digital filter multiplying the signals of taps by given filter factors and then performing addition and output, characterized in that the method comprises determining, based on basic filter factors having a symmetrical sequence in which values are set so that the sum is zero and the sum of every other terms is equal to the sum of the other every other terms with opposite signs, filter factors for the signals of the taps by converting the sequence of the basic filter factors and setting values so that the sum of the converted sequence is not zero and the sum of every other terms is equal to the sum of the other every other terms with the same signs in the converted sequence.

According to another aspect of the present invention, a method of designing a digital filter, the digital filter comprising a tapped delay line made up of a plurality of delay units, the digital filter multiplying the signals of taps by given filter factors and then performing addition and output, characterized in that the method comprises: cascading a basic filter in n stages (n=1), the basic filter being constituted using basic filter factors having a symmetrical sequence in which values are set so that the sum is not zero and the sum of every other terms is equal to the sum of the other every other terms with the same signs, and determining, as filter factors for the signals of the taps, nth-order filter factors obtained thus.

Another aspect of the present invention is characterized in that the signs of values other than the median of the sequence of the nth-order filter factors are reversed while causing the absolute values of the sequence to remain the same, and transfer filter factors obtained thus are determined as filter factors for the signals of the taps.

Another aspect of the present invention is characterized in that the signs of values other than the median of the sequence of the nth-order filter factors are reversed while causing the absolute values of the sequence to remain the same, the median of the sequence is subtracted from the reference value, and transfer filter factors obtained thus are determined as filter factors for the signals of the taps.

According to another aspect of the present invention, a method of designing a digital filter, the digital filter comprising a tapped delay line made up of a plurality of delay units, the digital filter multiplying the signals of taps by given filter factors and then performing addition and output, characterized in that the method comprises: cascading a basic filter in n stages (n=1), the basic filter being constituted using basic filter factors having a symmetrical sequence in which values are set so that the sum is zero and the sum of every other terms is equal to the sum of the other every other terms with opposite signs, and determining, as filter factors for the signals of the taps, nth-order filter factors obtained thus.

Another aspect of the present invention is characterized in that the signs of values other than the median of the sequence of the nth-order filter factors are reversed while causing the absolute values of the sequence to remain the same, and transfer filter factors obtained thus are determined as filter factors for the signals of the taps.

Another aspect of the present invention is characterized in that the signs of values other than the median of the sequence of the nth-order filter factors are reversed while causing the absolute values of the sequence to remain the same, the median of the sequence is subtracted from the reference value, and transfer filter factors obtained thus are determined as filter factors for the signals of the taps.

Another aspect of the present invention is characterized in that the pass frequency band of the filter is shifted by changing the delay rates of the delay units.

Another aspect of the present invention is characterized in that a filter using the filter factors obtained by the designing method according to any one of the aspects discussed above is cascaded in m stages (m=1), so that the pass frequency band of the filter is adjusted.

Another aspect of the present invention is characterized in that a cascade connection is arbitrarily made between a filter using the filter factors obtained by the designing method according to any one of the aspects of the invention discussed above and a filter using the filter factors obtained by the designing method according to any other aspect of the invention discussed above, so that the pass frequency band of the filter is adjusted.

According to another aspect of the present invention, a method of designing a digital filter, the digital filter comprising a tapped delay line made up of a plurality of delay units, the digital filter multiplying the signals of taps by given filter factors and then performing addition and output, characterized in that the method comprises: cascading a first basic filter in n stages (n=1), the first basic filter being constituted using first basic filter factors having a symmetrical sequence in which values are set so that the sum is not zero and the sum of every other terms is equal to the sum of the other every other terms with the same signs, and shifting the pass frequency band of the filter by changing the delay rates of the delay units, so that nth-order filter factors are obtained, cascading a second basic filter in m stages (m=1), the second basic filter being constituted using second basic filter factors having a symmetrical sequence in which values are set so that the sum is zero and the sum of every other terms is equal to the sum of the other every other terms with opposite signs, shifting the pass frequency band of the filter by changing the delay rates of the delay units, so that mth-order filter factors are obtained, cascading the filter using the nth-order filter factors and the filter using the mth-order filter factors, reversing the signs of values other than the median of the sequence of the filter factors obtained by the cascade connection while causing the absolute values of the sequence to remain the same, and subtracting the median of the sequence from a reference value, so that transfer filter factors obtained thus are determined as filter factors for the signals of the taps.

Another aspect according to the present invention, a method of designing a digital filter, the digital filter comprising a tapped delay line made up of a plurality of delay units, the digital filter multiplying the signals of taps by given filter factors and then performing addition and output, characterized in that based on first filter factors having a symmetrical sequence in which values are set so that the sum is not zero and the sum of every other terms is equal to the sum of the other every other terms with the same signs or having a sequence in which values are set so that the sum is zero and the sum of every other terms is equal to the sum of the other every other terms with opposite signs, determining second filter factors obtained when a basic filter constituted using the first filter factors is cascaded in a plurality of stages based on the first filter factors, the second filter factors are obtained when the basic filter is cascaded for the number of stages where a frequency changing with the number of cascaded stages exceeds a target frequency; reversing the signs of values other than the median of the sequence of the second filter factors while causing the absolute values of the sequence to remain the same based on the determined second filter factors, and subtracting the median of the sequence from a reference value, so that transfer filter factors are obtained; and determining third filter factors obtained when an interim product filter constituted using the transfer filter factors is cascaded in a plurality of stages based on the transfer filter factors, the third filter factors are obtained when the interim product filter is cascaded for the number of stages where a frequency changing with the number of cascaded stages exceeds the target frequency, similarly determining, based on the determined third filter factors, transfer factors and filter factors repeatedly, the filter factors being obtained when the interim product filter constituted using the transfer filter factors is cascaded, and reducing an error between a frequency obtained thus and the target frequency to determine final filter factors.

DETAILED DESCRIPTION OF THE PREFERRED EMBODIMENTS

An embodiment of the present invention will be described below in accordance with the accompanying drawings.

A digital filter of the present embodiment is a transversal FIR filter, which comprises a tapped delay line made up of a plurality of delay units and performs addition and output after multiplying signals of taps by several times according to given filter factors. In the FIR filter, when a sequence of a plurality of filter factors applied to the filter is symmetrical, linear phase characteristics are obtained and a circuit is always stable.

Figure 2:
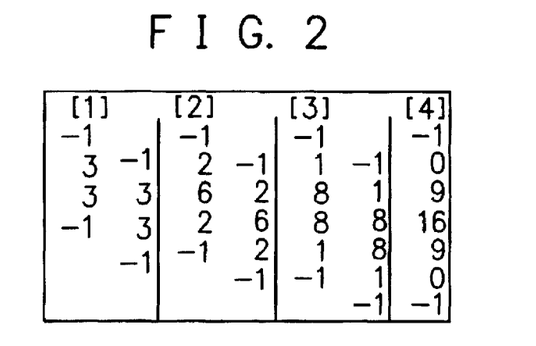
FIG. 2 is an explanatory drawing showing basic filter factors.

In the present embodiment, a sequence $\{-1, 0, 9, 16, 9, 0, -1\}$ indicated by [4] of FIG. 2 is used as basic symmetrical filter factors applied to the FIR filter. The filter factors indicated by [4] have a symmetrical sequence whose sum is not 0. In the sequence, the sum of every other terms is equal to the sum of the other every other terms with the same signs $(-1+9+9+(-1)=16, 0+16+0=16)$.

The filter factors indicated by [4] of FIG. 2 are obtained by performing a moving-average calculation once on a digital basic function indicated by [3] of FIG. 2. The digital basic function changes a data value to $-1, 1, 8, 8, 1, -1$ for each clock. The sequence of the digital basic function is obtained by performing the moving average calculation twice on a sequence indicated by [1] of FIG. 2.

Figure 19A:
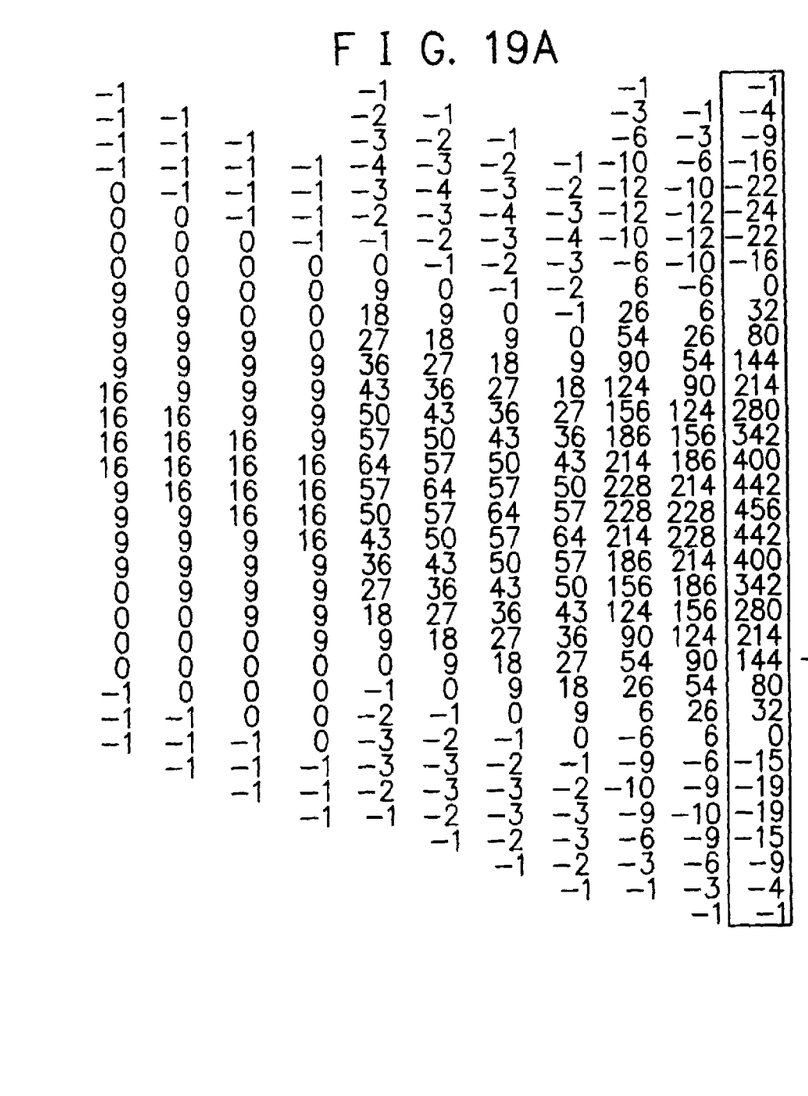
FIGS. 19A and 19B are diagrams for explaining the meaning of a digital basic function used in the present embodiment.
Figure 19B:
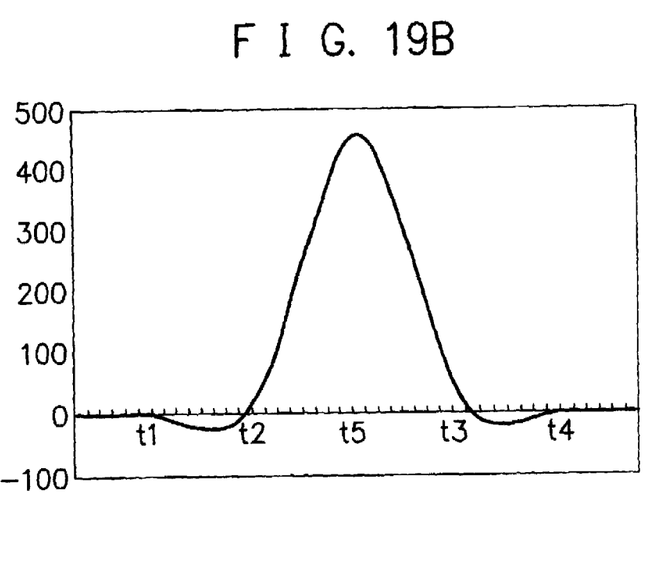

Referring to FIGS. 19A and 19B, the following will describe the meaning of the sequence of the digital basic function.

FIGS. 19A and 19B are diagrams showing the results of quadruple oversampling and convolution on the sequence $\{-1, 0, 9, 16, 9, 0, -1\}$ which is obtained by performing the moving average calculation once on the digital basic function.

In FIG. 19A, a series of numeric values on the leftmost column is obtained by performing quadruple oversampling on the original sequence $\{-1, 0, 9, 16, 9, 0, -1\}$. Further, numeric values in four columns from the left to the right are obtained by shifting down the numeric values of the leftmost sequence one by one. The column direction of FIG. 19A indicates a time base. Shifting down numeric values is to gradually delay the numeric values of the leftmost column.

Namely numeric values in the second column from the left indicate numeric values obtained by shifting the numeric values of the leftmost column by a quarter phase of a clock 4CK of a quadruple frequency. Further, numeric values in the third column from the left indicate numeric values obtained by shifting numeric values in the second column from the left by a quarter phase of the clock 4CK of a quadruple frequency, and numeric values in the fourth column from the left indicate numeric values obtained by further shifting numeric values in the third column from the left by a quarter phase of the clock 4CK of a quadruple frequency.

Moreover, numeric values in the fifth column from the left are obtained by adding numeric values in the corresponding rows of the first to fourth columns and dividing the results by four. With the processing on the five columns from the left, quadruple oversampling is performed in a digital fashion together with four-phase convolution.

Numeric values in four columns from the fifth column to the right are obtained by shifting down numeric values in the fifth column one by one. Further, numeric values in the ninth column from the left are obtained by adding numeric values in the corresponding rows of the fifth to eighth columns and dividing the results by four. With the processing on the nine columns from the left, quadruple oversampling is performed twice in a digital fashion together with four-phase convolution.

Besides, numeric values in the tenth column from the left are obtained by shifting down numeric values in the ninth column by one. Additionally, numeric values in the eleventh column (rightmost column) are obtained by adding numeric values in the corresponding rows of the ninth column and the tenth column and dividing the results by two.

The final numeric values in the rightmost column of FIG. 19A are shown in graph form in FIG. 19B. A function with the waveform of FIG. 19B has a finite value other than "0" only when a sample position along the horizontal axis lies between t1 and t4. In other areas, the function always has a value "0", that is the value of the function converges to "0" at the sample positions t1 and t4. In this way, when the function has a finite value other than "0" in a local area and has "0" in other areas, this state is referred to as "finite base."

Moreover, the function of FIG. 19B is a sampling function which has the maximum value only on a sample position t5 at the center and has "0" on four sample positions of t1, t2, t3, and t4. The function passes through all the sample points required for data of a smooth waveform.

Figure 3:
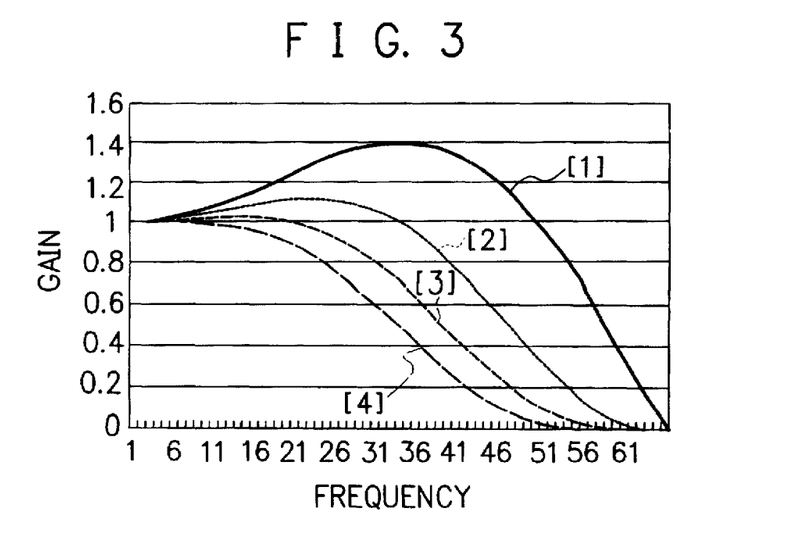
FIG. 3 is a diagram showing frequency-gain characteristics of the filter factors shown in FIG. 2.

FIG. 3 shows frequency-gain characteristics of the results of FFT (Fast Fourier Transfer) performed on the sequences [1] to [4] of FIG. 2. Besides, a again is standardized at "1" in FIG. 3. As is understood from the characteristic diagram, when the sequence [4] is used as filter factors, a center frequency has a gain of 0.5 and excellent low-pass filter characteristics can be obtained so that no overshoot occurs in a low frequency area and no ringing occurs in a high frequency area.

The sequence $\{-1, 0, 9, 16, 9, 0, -1\}$ achieving such low-pass filter characteristics is a basic sampling function of a finite base shown in FIG. 19B. While a conventionally used sampling function converges to "0" on a sample position $t=\pm\infty$, the sampling function of FIG. 19B converges to "0" on a finite sample position t=t1, t4.

Thus, when FFT is performed on the sequence, only data corresponding to the range of t=t1 to t4 is significant. Data corresponding to a range other than t=t1 to t4 is ignored. This is not because the data should be essentially considered but because the data does not have to be considered in theory. Hence, no truncation error occurs. Therefore, by using the sequence as filter factors, it is possible to obtain excellent low-pass filter characteristics without the necessity for truncating factors by a window function. Hence, the sequence is used for a basic low-pass filter.

Figure 1:
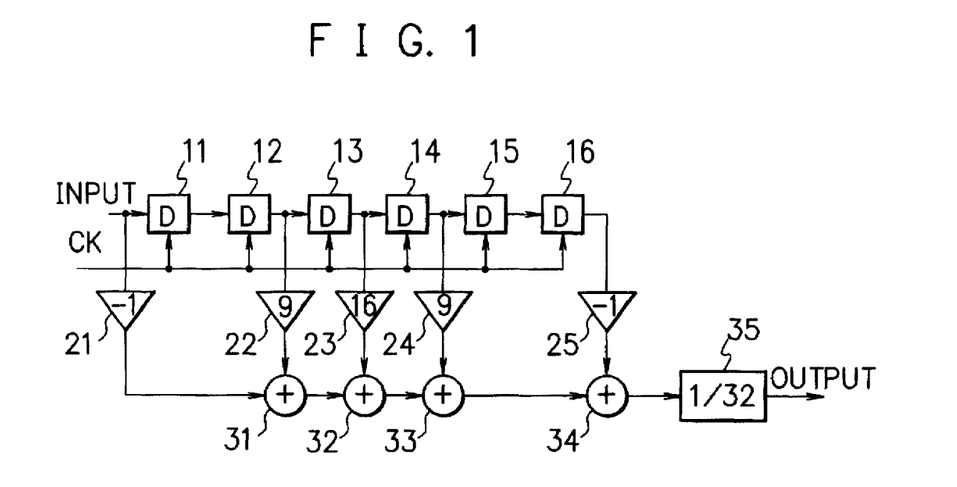
FIG. 1 is a diagram showing a structural example of a basic low-pass filter.

FIG. 1 is a diagram showing a structural example of the basic low-pass filter. In this filter, six cascaded D-type flip-flops 11 to 16 sequentially delay input signals by one clock CK. Then, signals extracted from the input/output taps of the D-type flip-flops 11 to 16 are multiplied by five factor units 21 to 25 by the filter factors of the sequence [4], the multiplication results are all added by adders 31 to 34, and the results are outputted.

A 1/32 multiplier 35 provided in the output stage of the adder 34 is used to return an amplitude, which has been increased by performing a product-sum operation on the signals of the taps and the filter factors, to the original amplitude. That is, a gain is standardized at "1". A value "32" is the result of adding all the filter factor values $(-1+0+9+16+9+0+(-1)=32)$. In this case, the integer sequence indicated by [4] of FIG. 2 is used as basic filter factors and an addition output is multiplied by 1/32. The values of the filter factors may be multiplied by 1/32.

Figure 4:
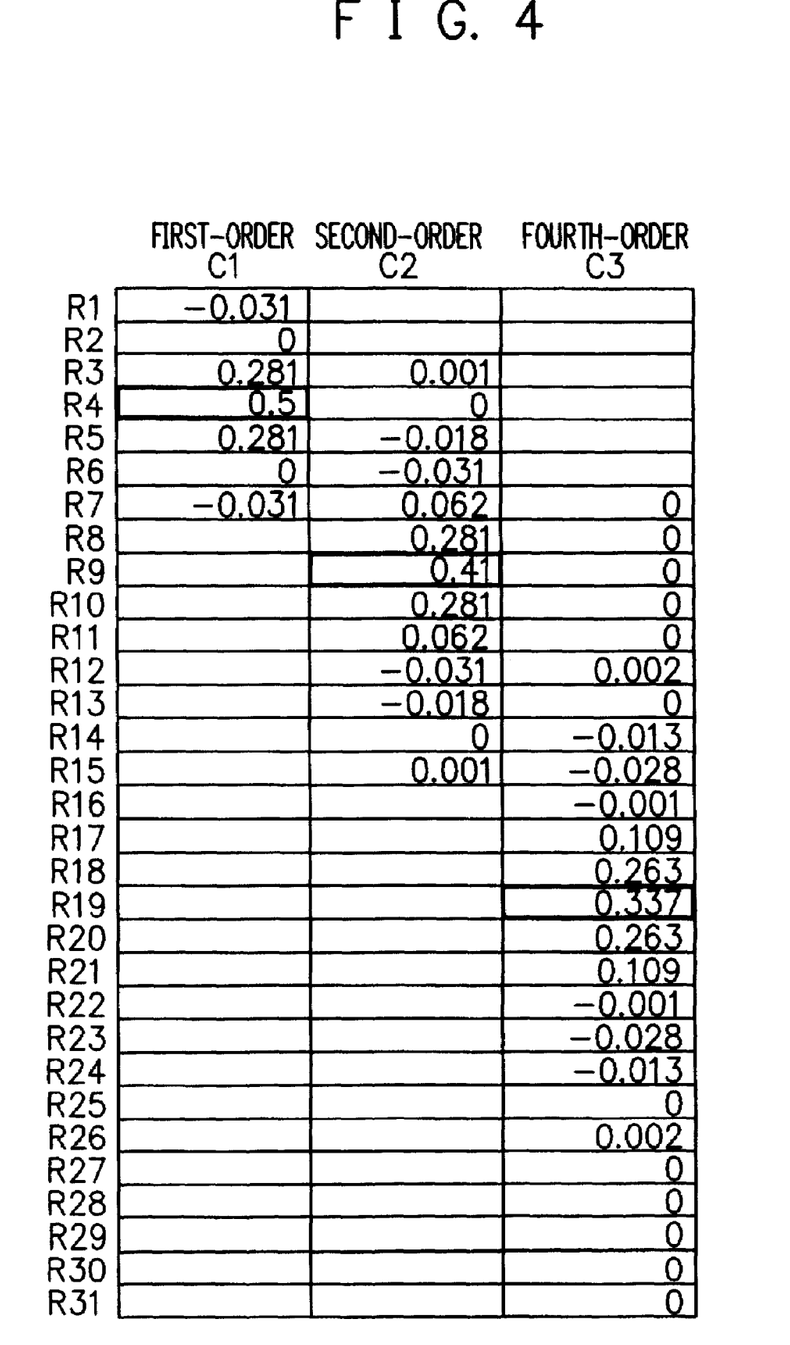
FIG. 4 is a diagram showing the sequences of nth-order filter factors obtained by cascading the basic low-pass filter in n stages (n=1)

FIG. 4 is a diagram showing nth-order filter factors that are obtained by cascading the basic low-pass filter of FIG. 1 in n stages (n=1). FIG. 4 shows first-order, second-order, and fourth-order filter factors as representatives. Additionally, the shown filter factors have factor values which are multiplied by 1/32 and is rounded by $10^{-3}$.

As described above, the first-order low-pass filter factors are composed of a sequence having seven filter factors of (−1, 0, 9, 16, 9, 0, −1)/32. Meanwhile, the second-order low-pass filter factors obtained by cascading the basic low-pass filter in two stages have 13 filter factors, and the fourth-order low-pass filter factors obtained by cascading the basic low-pass filter in four stages have 25 filter factors. In this way, the number of filter factors increases with the number of cascaded stages.

In the first-order, second-order, and fourth-order filter factors of FIG. 4, thick frames indicate the medians of the filter factors. In FIG. 4, filter factors in R[i] column and C[j] row in the second-order and fourth-order filter factors are determined by the formula below.

$$(-(R[i-8]C[j-1]+R[i-2]C[j-1])+(R[i-6]C[j-1]+R[i-4]C[j-1])*9+R[i-5]C[j-1]*16)/32$$

Figure 5:
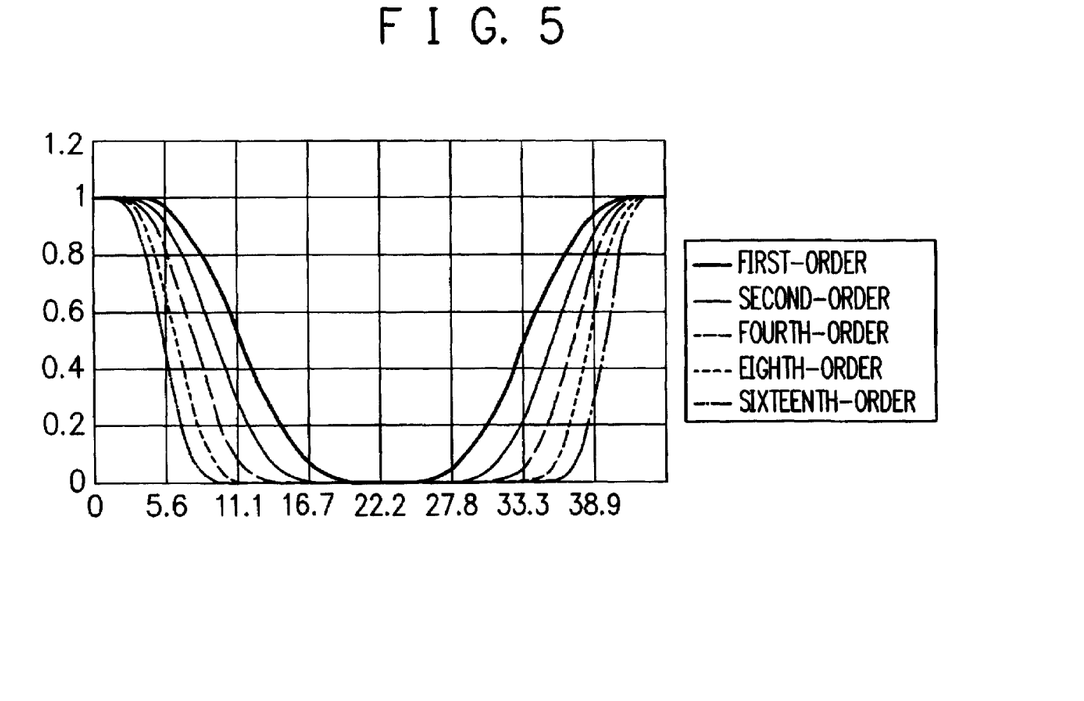
FIG. 5 is a diagram showing frequency-gain characteristics as a result of FFT on the sequence of nth filter factors (n=1, 2, 4, 8, 16)

FIG. 5 is a diagram showing the frequency-gain characteristics of FFT results on the sequence of filter factors of an nth-order (n=1, 2,4,8, and 16) low-pass filter. The example of FIG. 5 shows filter characteristics obtained when a signal quantized at a sampling frequency of 44.1 KHz is transmitted through a low-pass filter having a delay rate of 44.1 KHz (clock CK fed to the D-type flip-flops 11 to 16 has a frequency of 44.1 KHz).

As shown in FIG. 5, the basic low-pass filter is cascaded in n stages and the order is increased, so that a cut-off frequency and the inclination of an intermediate cut-off band (transient band) between a pass band and a stop band can be changed step by step. That is, the basic low-pass filter is cascaded in a given number of stages, so that it is possible to readily design a low-pass filter having desired characteristics of the inclination of the cut-off band and the cut-off frequency. Additionally, as is understood from FIG. 5, a change in the inclination of the cut-off band and the cut-off frequency gradually decreases as the order increases.

Figure 6:
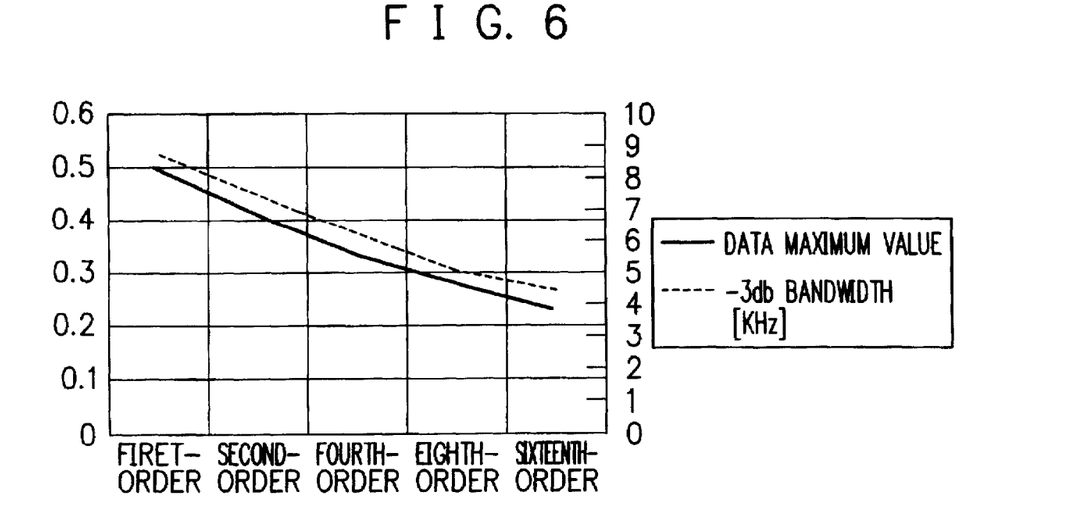
FIG. 6 is a diagram showing the correlation between the maximum value of first-order to 16th-order filter factors and the bandwidth of a cut-off frequency.

FIG. 6 is a diagram showing the correlation between the maximum value (median) of the first-order to sixteenth-order filter factors and the bandwidth of the cut-off frequency having a gain lower than a flat portion by −3 db. As is understood from FIG. 6, the maximum value and the bandwidth are correlated with each other and both of the maximum factor value and the cut-off frequency decrease as the order increases. FIG. 5 also shows that the cut-off frequency gradually decreases. The cut-off frequency can be finely adjusted and a method thereof will be described later.

In the present embodiment, the sequence with ratios of {−1, 0, 9, 16, 9, 0, −1} is used as basic filter factors. Hence, the basic low-pass filter can be cascaded in any number of stages while achieving excellent low-pass filter characteristics permitting the pass band to have flat characteristics without causing an overshoot. Since the basic filter factors used in the present embodiment have such characteristics, various kinds of digital filters with arbitrary frequency characteristics can be readily designed based on the basic low-pass filter (will be described later).

Further, in the present embodiment, the frequency band of the low-pass filter can be shifted by changing the delay rate (clock rate) of the D-type flip-flops 11 to 16. For example, when a sound signal is quantized by a sampling clock of 44.1 KHz, in order to set the pass band of the low-pass filter at 0 to 22 KHz and remove frequency components of 23 to 44.1 KHz from the quantized signal, it is necessary to increase the clock frequency of the D-type flip-flops 11 to 16 to 88.2 KHz or higher (when the clock frequency is 44.1 KHz, the pass band cannot be set at 0 to 22 KHz).

Figure 7:
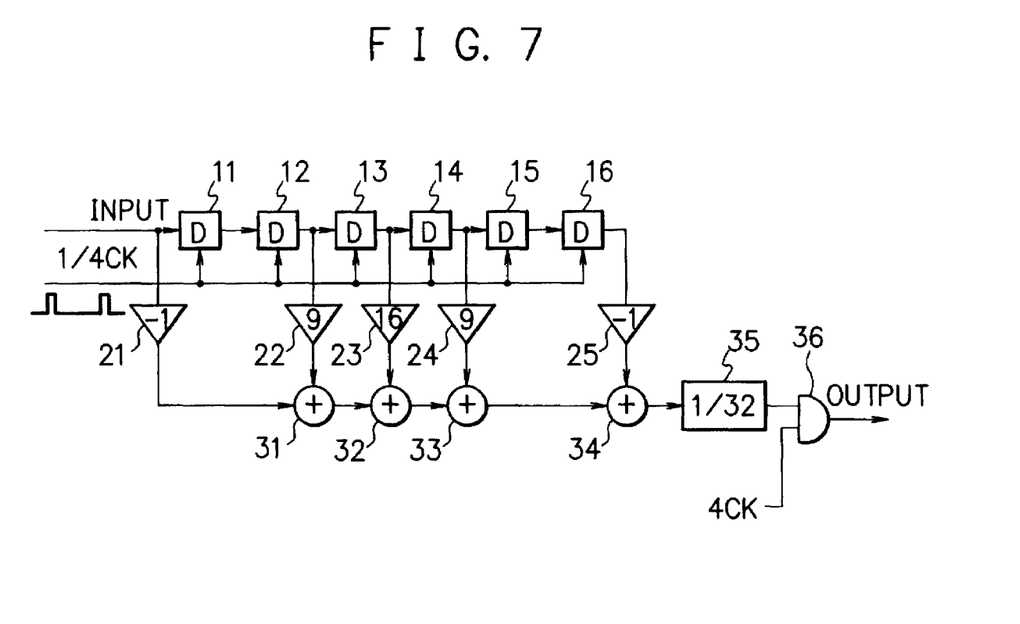
FIG. 7 is a diagram showing a structural example of a low-pass filter having a one-fourth clock rate.

Conversely, low-pass filters with different frequency characteristics can be obtained by reducing the clock rate of the D-type flip-flops 11 to 16 to 1/n of the sampling frequency. FIG. 7 is a diagram showing a structural example of the low-pass filter having a clock rate reduced to a quarter. Constituent elements having the same functions as FIG. 1 are indicated by the same reference numerals. The clock with a quarter clock rate is not limited to FIG. 7. A clock with a duty ratio of 50% may be used.

Figure 8:
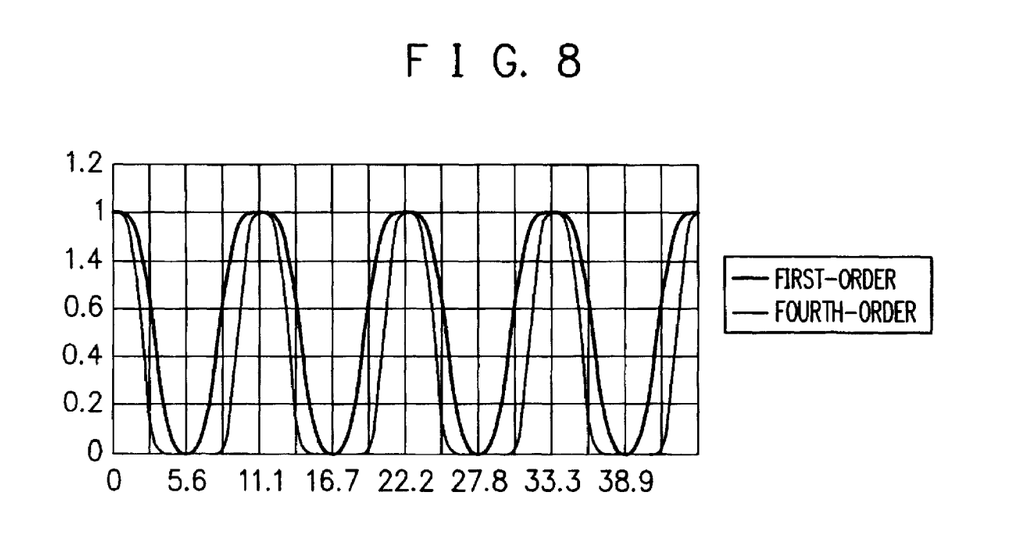
FIG. 8 is a diagram showing frequency-gain characteristics of the low-pass filter of FIG. 7 and a fourth-order low-pass filter cascaded in four stages.

FIG. 8 is a diagram showing the frequency-gain characteristics of the low-pass filter of FIG. 7 and a fourth-order low-pass filter obtained by cascading the low-pass filter in four stages. As is understood from a comparison between FIG. 8 and FIG. 5, when the clock rate is reduced, the bandwidth of the pass band is also reduced and the cut-off band is tilted more sharply. Thus, simply by changing the clock rate, it is possible to readily design a low-pass filter having desired characteristics of the inclination of the cut-off band and the cut-off frequency. Moreover, by using such characteristics, various kinds of digital filters can be readily designed with arbitrary frequency characteristics (will be described later).

Furthermore, it is possible to readily derive a bypass filter based on the basic low-pass filter. The bypass filter obtained thus is considered to be a symmetrical bypass filter which has frequency-gain characteristics laterally symmetrical with respect to a certain frequency axis as compared with the basic low-pass filter, and a complementary high-pass filter which has a gain perfectly set at 1 (reference value) in all the frequency bands when the gain outputs of the basic low-pass filter and the high-pass filter are summed.

When a single pulse having a gain standardized at 1 is inputted to the basic low-pass filter of FIG. 1, the basic filter factors {−1, 0, 9, 16, 9, 0, −1} are outputted through the factor units 21 to 25. The sequence of the filter factors is considered to represent the characteristics of the low-pass filter. Therefore, a high-pass filter can be fabricated by changing the sequence of the filter factors of the basic low-pass filter.

For example, in order to maintain the symmetrical property with respect to the basic low-pass filter, the signs of values other than the median are changed while the absolute values of the sequence are maintained. A sequence satisfying such a condition for the basic filter factors is {1, 0, −9, 16, −9, 0, 1}. In this way, it is possible to obtain a high-pass filter having laterally symmetrical characteristics with respect to frequency axes which are 1/4 and 3/4 of the sampling frequency.

Figure 9:
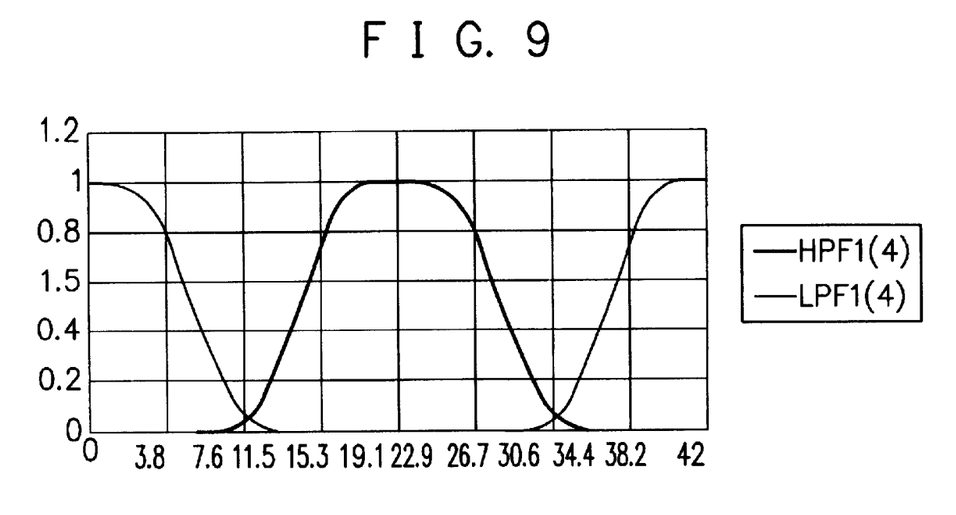
FIG. 9 is a diagram showing frequency-gain characteristics of a low-pass filter with a fourth-order rate 1 and a symmetrical high-pass filter with the fourth-order clock rate 1.

FIG. 9 is a diagram showing the frequency-gain characteristics of a low-pass filter, which has the fourth-order clock rate 1 (reference clock CK) of the basic low-pass filter cascaded in four stages, and a symmetrical high-pass filter, which has the fourth-order clock rate 1 of a high-pass filter cascaded in four stages. The cascaded high-pass filter uses transfer filter factors generated by changing the signs of the basic filter coefficients.

As is understood from the characteristic diagram, as compared with a fourth-order low-pass filter, it is possible to obtain a fourth-order high-pass filter with laterally symmetrical characteristics with respect to the frequency axes which are 1/4 and 3/4 of the sampling frequency (44.1 KHz). Additionally, completely the same sequence is obtained in the case where the filter factors of the fourth-order low-pass filter are determined and then the sequence is converted to transfer filter factors and in the case where the filter factors of the first-order low-pass filter are converted to transfer filter factors and then the filter factors of the fourth-order high-pass filter are determined based on the transfer filter factors.

Further, in another example, in the case where factors corresponding to the sequence {−1, 0, 9, 16, 9, 0, −1} of the filter factors of the basic low-pass filter are added to the corresponding factors, when the addition result of medians is 32 (reference value obtained by summing the values of the sequence, and the reference value is 1 when the values of the filter factors are multiplied by $\frac{1}{32}$) and the addition results of other values are 0, the sequence acts as new filter factors. Thus, it is possible to obtain a high-pass filter characterized in that the sequence of obtained filter factors has a sum of 0, the sums of every other values of the sequence are equal with opposite signs, and a sum including the gain of the low-pass filter is perfectly 1 in all the frequency bands.

Figure 10:
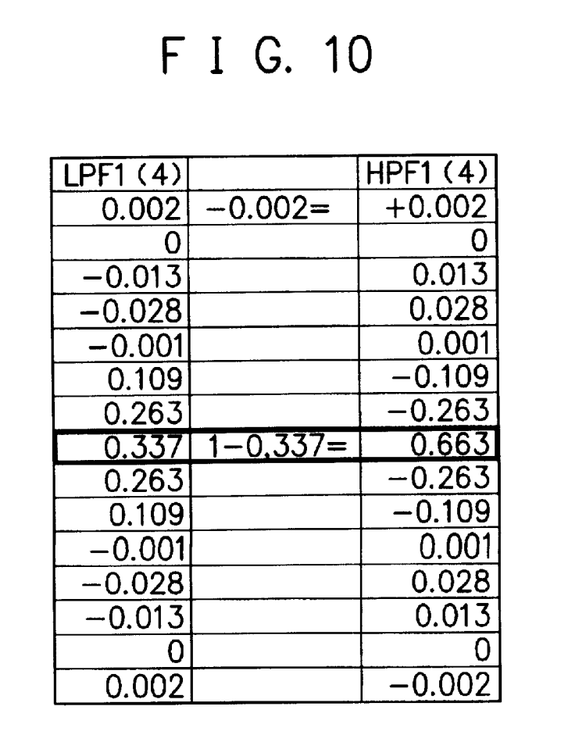
FIG. 10 is a diagram which explains transfer for obtaining high-pass filter factors with the fourth-order clock rate 1 from the low-pass filter factors with the fourth-order clock rate 1.

FIG. 10 is a diagram for explaining transfer which determines filter factors used for the high-pass filter with the fourth-order clock rate 1 from filter factors used for the low-pass filter with the fourth-order clock rate 1. The following will describe an example where the values of the filter factors are multiplied by $\frac{1}{32}$ and are rounded by $10^{-3}$. The rounding result of 0 is not shown in FIG. 10.

First the filter factors of the fourth-order low-pass filter are extracted to the third decimal place (first column of the chart). Then, regarding values other than the median of the sequence of the extracted filter factors, signs are reversed while absolute values are caused to remain the same. Regarding the median of the sequence, the median is subtracted from the reference value (the reference value is 1 in this case, in the second column of the chart). Transfer filter factors obtained thus (third column of the chart) are the filter factors of the fourth-order high-pass filter to be determined.

Figure 11:
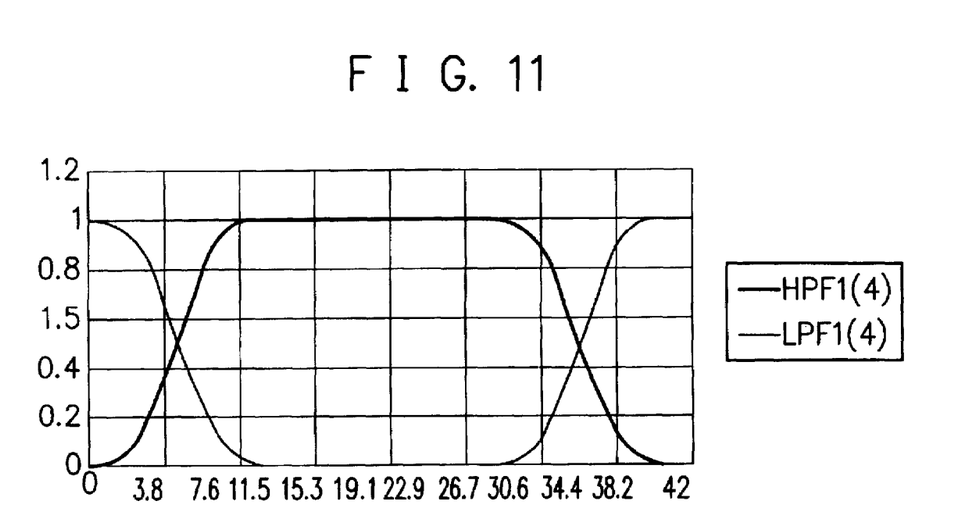
FIG. 11 is a diagram showing frequency-gain characteristics of a low-pass filter with the fourth-order clock rate 1 and a complementary high-pass filter with the fourth-order clock rate 1.

FIG. 11 is a diagram showing the frequency-gain characteristics of a low-pass filter, which has the fourth-order clock rate 1 of the basic low-pass filter cascaded in four stages, and a complementary high-pass filter, which has the fourth-order clock rate 1 of a high-pass filter cascaded in four stages. The cascaded high-pass filter uses transfer filter factors generated by changing the signs and so forth of the basic filter factors.

As is understood from the characteristic diagram, as compared with the fourth-order low-pass filter, it is possible to obtain a fourth-order high-pass filter characterized in that the sum including the gain of the fourth-order low-pass filter is perfectly 1 in all the frequency bands. Additionally, completely the same sequence is obtained in the case where the filter factors of the fourth-order low-pass filter are determined and then the sequence is converted to transfer filter factors and in the case where the filter factors of the first-order low-pass filter are converted to transfer filter factors and then the filter factors of the fourth-order high-pass filter are determined from the transfer filter factors.

As described above, according to the present embodiment, the sequence satisfying predetermined conditions is provided as the basic filter factors to be provided to an FIR low-pass filter. Thus, a high-pass filter can be designed by a simple operation of changing the signs of the filter factors of a low-pass filter.

The above explanation described an example where based on the low-pass filter using the sequence with ratios of {−1, 0, 9, 16, 9, 0, −1} as filter factors, the filter factors are transferred to determined the filter factors of the high-pass filter. Conversely, based on a high-pass filter using the sequence with ratios of {1, 0, −9, 16, −9, 0, −1} as filter factors, the filter factors may be transferred to determine the filter factors of a low-pass filter.

The following will describe an example where an FIR digital filter is designed with desired frequency characteristics by using the cascade connection of filters, the change of a clock rate, and the transfer of filter factors. As an example, a low-pass filter is designed with a sampling frequency of 44.1 KHz and a −3 db frequency (cut-off frequency) of 20 KHz.

Figure 12:
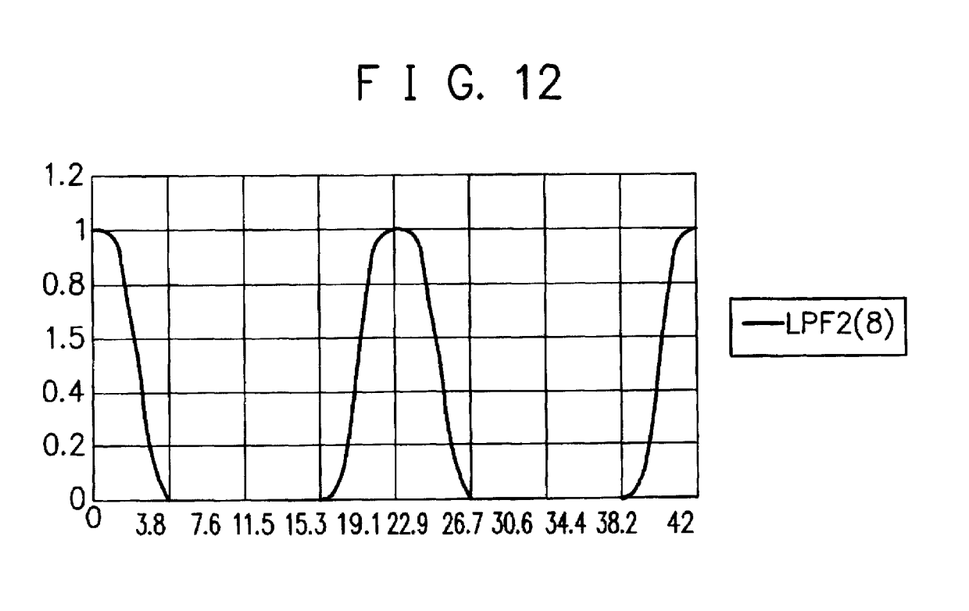
FIG. 12 is a diagram showing frequency-gain characteristics of a low-pass filter with an eighth-order clock rate ½.

First, based on the basic low-pass filter, a low-pass filter LPF2(n) is fabricated with an nth-order clock rate ½ (clock CK/2). In this case, as shown in FIG. 12, the order n is adjusted to cause the pass band of the filter to have a required bandwidth. In the example of FIG. 12, the basic low-pass filter is cascaded in eight stages to fabricate an eighth-order low-pass filter.

Figure 13:
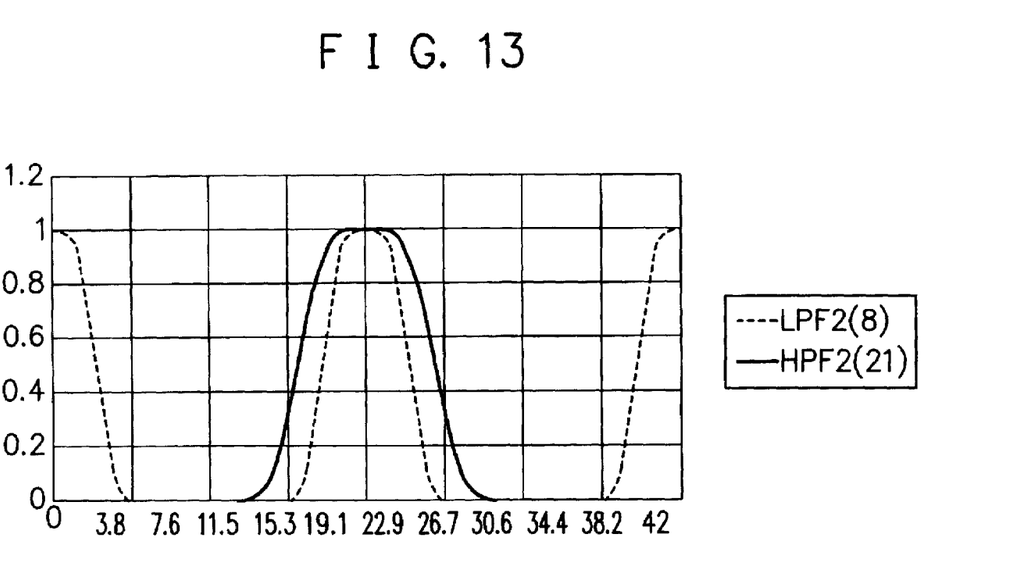
FIG. 13 is a diagram showing frequency-gain characteristics of a high-pass filter with a 21st-order clock rate 1.

In addition, a high-pass filter HPF1(n) is fabricated with an nth-order clock rate 1 based on the basic high-pass filter (obtained by transferring the filter factors of the basic low-pass filter). In this case, as indicated by the solid line of FIG. 13, the order n is adjusted to cause the pass band of the filter to have a sufficiently small bandwidth. In the example of FIG. 13, the basic high-pass filter is cascaded in 21 stages to fabricate a 21st-order high-pass filter. For comparison, FIG. 13 also shows the characteristics of the eighth-order low-pass filter (dotted line) of FIG. 12.

Figure 14:
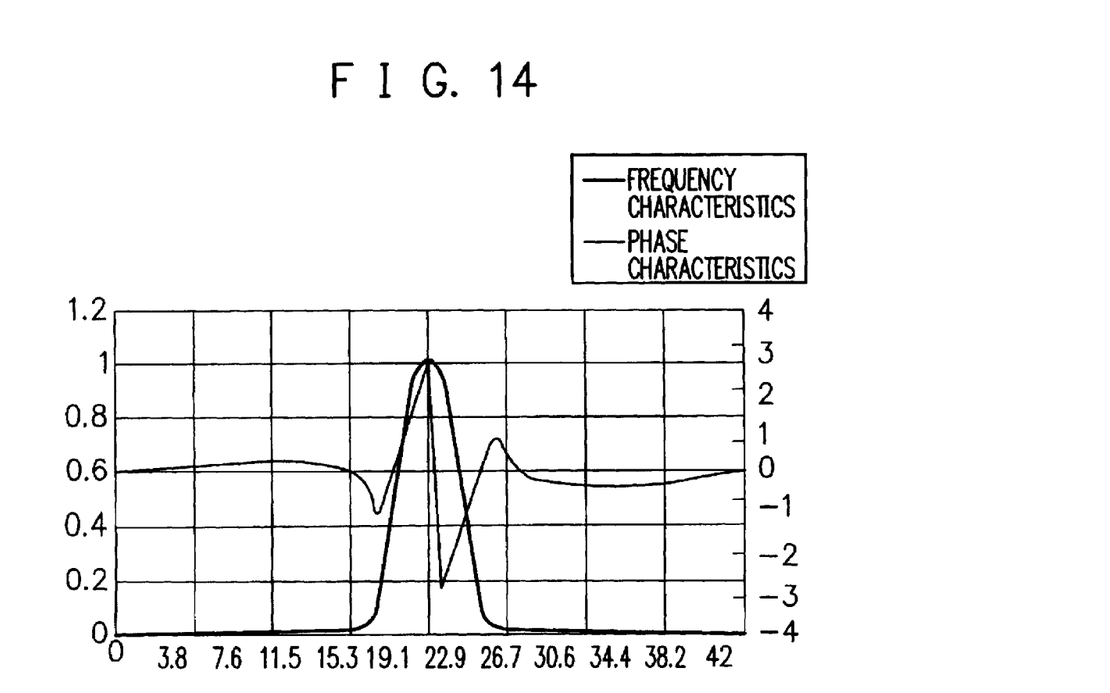
FIG. 14 is a diagram showing frequency-gain characteristics obtained by combining the eighth-order low-pass filter of FIG. 12 and the 21st-order high-pass filter of FIG. 13.

Subsequently, the eighth-order low-pass filter LPF2(8) and 21st-order high-pass filter HPF1(21) fabricated thus are cascaded in the above manner, so that an overlapping portion of the pass bands is extracted. FIG. 14 is a diagram showing the frequency-gain characteristics and frequency-phase characteristics in this case. As is understood from FIG. 14, it is possible to obtain a high-pass filter having frequency characteristics of a pass band having a sufficiently small bandwidth and a cut-off band having sufficient inclination. Additionally, substantially linear phase characteristics can be also achieved.

In this case, the bandwidth of the pass band is reduced by the combination of the eighth-order low-pass filter and the 21st-order high-pass filter. The bandwidth of the pass band may be reduced by increasing the order of the high-pass filter. However, as described above, the inclination of the cut-off band and a change in cut-off frequency gradually decrease as the order increases. Therefore, the bandwidth of the pass band is reduced in a limited manner when the order is simply increased. Further, a too large order increases the number of stages of a digital filter, resulting in a large circuit. In contrast, with the method of combining the low-pass filter and the high-pass filter, the bandwidth of the pass band can be sufficiently reduced without the necessity for a large order.

Figure 15:
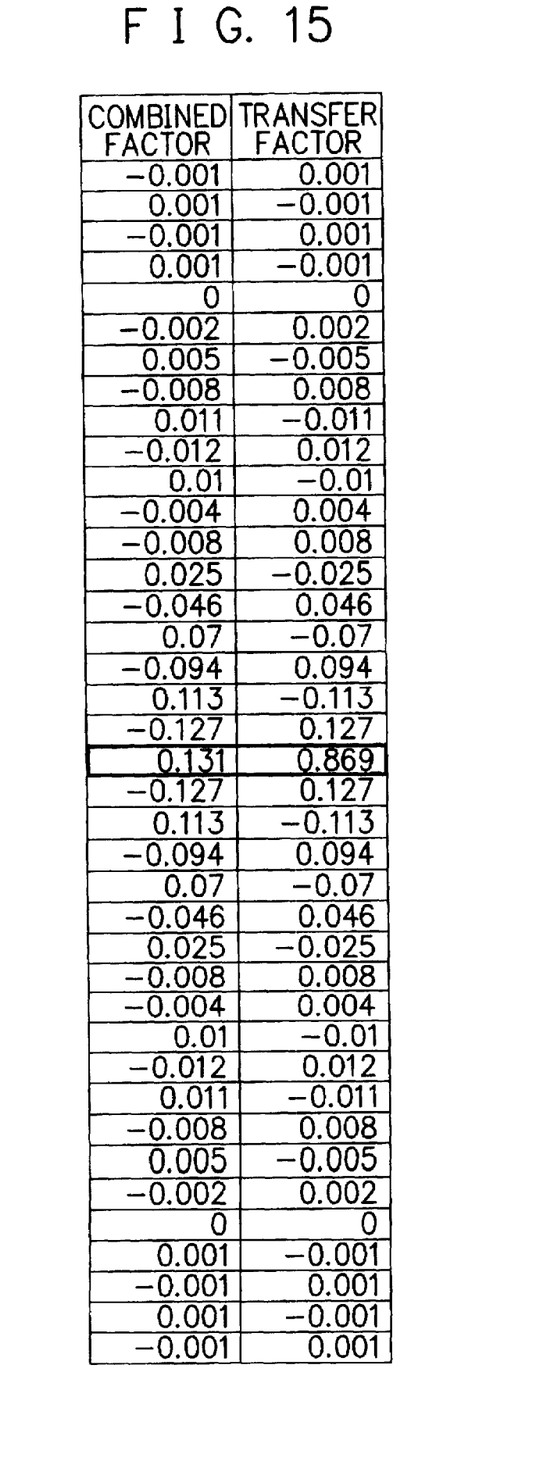
FIG. 15 is a diagram for explaining transfer to complementary transfer factors from the combined filter factors of eighth-order low-pass filter and 21st-order high-pass filter.

Subsequently, the factors of the high-pass filter that are obtained by combination are rounded by $10^{-3}$ and then the factors are converted to complementary transfer factors. The results are shown in FIG. 15. In FIG. 15, the left sequence shows the results of rounding combined filter factors by $10^{-3}$ and the right sequence shows the results of conversion into complementary transfer factors. In this way, the filter factors of the low-pass filter are obtained by converting the filter factors of the high-pass filter into transfer filter factors. Then, a desired low-pass filter is constituted while the sequence of transfer filter factors on the right side of FIG. 15 is used as new filter factors. Further, the low-pass filter is cascaded in a plurality of stages to adjust an order, and the bandwidth of the pass band is adjusted.

Figure 16:
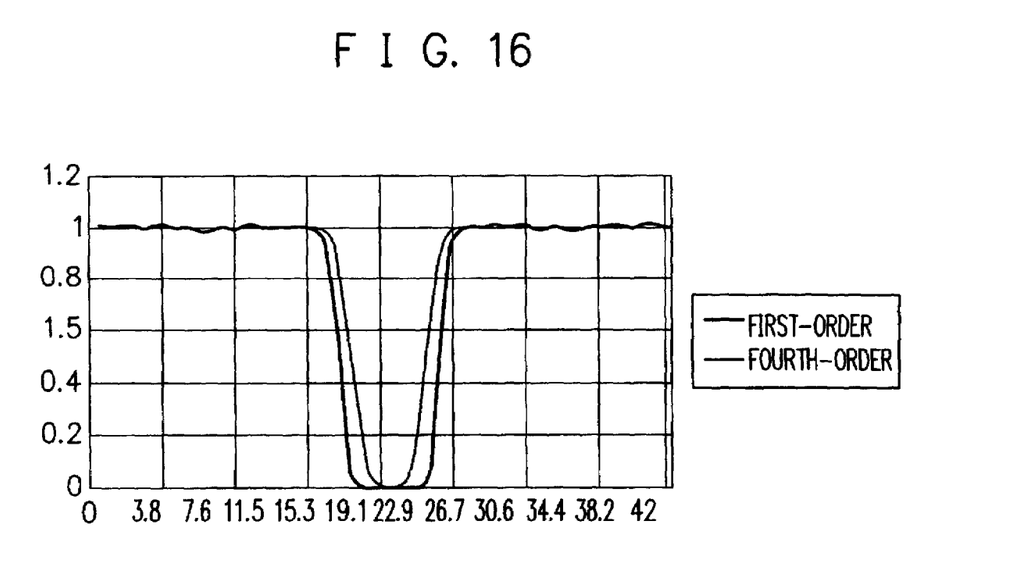
FIG. 16 is a diagram showing frequency-gain characteristics of a low-pass filter, which is a final product.
Figure 17:
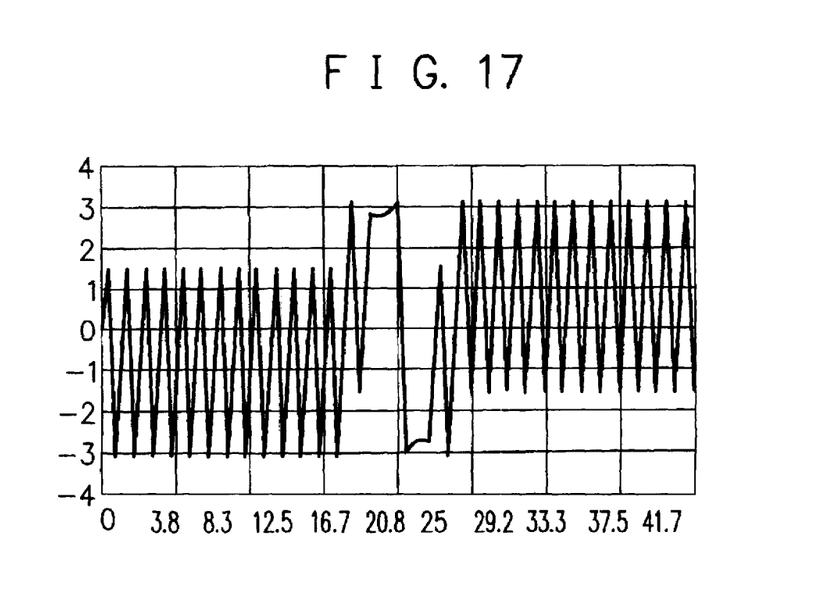
FIG. 17 is a diagram showing frequency-gain characteristics of the low-pass filter, which is a final product.

FIGS. 16 and 17 are diagrams showing the frequency-gain characteristics and frequency-phase characteristics of the low-pass filter fabricated thus. As is understood from FIGS. 16 and 17, it is possible to obtain an almost ideal low-pass filter in which a cut-off frequency is about 20 KHz, a pass band is almost flat, and the inclination of a cut-off band is extremely large. Moreover, linear phase characteristics are also achieved.

As described above, according to the present embodiment, the basic low-pass filter which uses the sequence with ratios of {−1, 0, 9, 16, 9, 0, −1} is used as filter factors, and the cascade connection of filters, the conversion of a clock rate, and the transfer of filter factors are arbitrarily combined and applied, so that a digital filter having desired frequency characteristics can be designed with great ease.

The following will describe a method of finely adjusting a cut-off frequency by cascading a filter and transferring filter factors.

As described above, when the order of the low-pass filter is increased, the cut-off frequency decreases. Conversely, when the order of the high-pass filter is increased, the cut-off frequency increases. Additionally, these changes gradually decrease with the order.

Figure 18A:
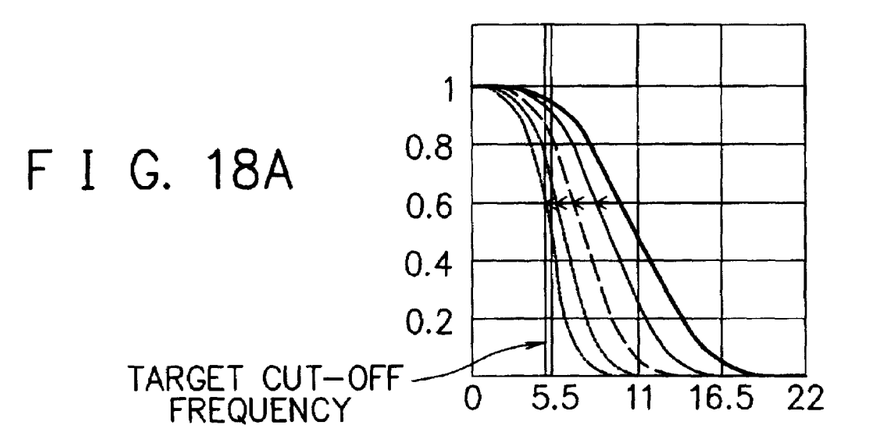
FIGS. 18A to 18C are diagrams for explaining a method of finely adjusting a cut-off frequency.
Figure 18B:
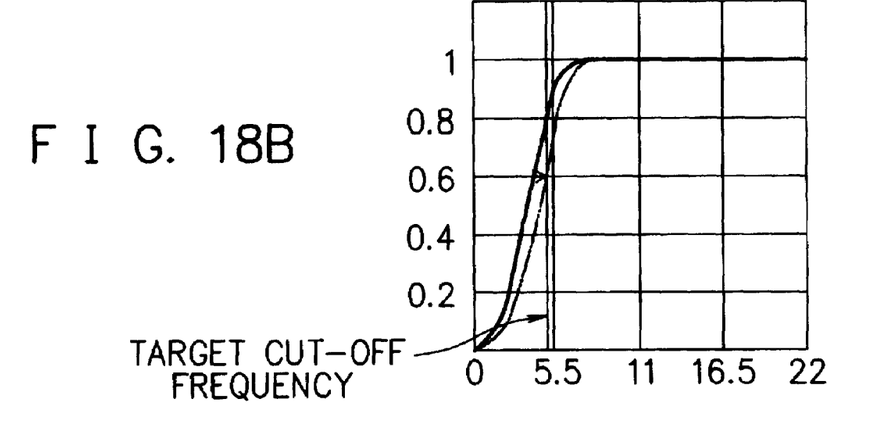
Figure 18C:
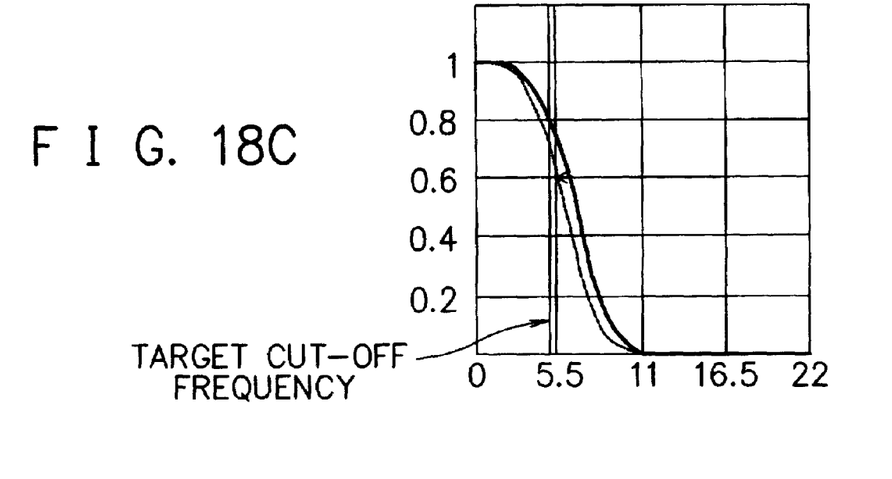

As shown in FIGS. 18A to 18C, the number of cascaded stages in a first-order low-pass filter is first increased one by one by using the such properties. At this point of time, the number of cascaded stages is increased until a cut-off frequency reduced by a cascade connection exceeds a target cut-off frequency (FIG. 18A). Then, when the low-pass filter is cascaded in n stages with a cut-off frequency exceeding the target cut-off frequency, filter factors obtained by the cascade connection are converted into complementary transfer factors. Hence, it is possible to obtain the filter factors of an nth-order high-pass filter.

Subsequently, the number of cascaded stages of the nth-order high-pass filter obtained thus is increased one by one. In this case, since the nth-order high-pass filter is cascaded, a change in cut-off frequency is further reduced following a change of the first-order low-pass filter cascaded in n stages. Then, the number of cascaded stages is increased until the increasing cut-off frequency exceeds the target cut-off frequency again from the opposite direction (FIG. 18B).

Then, when the nth-order high-pass filter is cascaded in m stages with a cut-off frequency exceeding the target cut-off frequency, filter factors obtained by the cascade connection are converted into complementary transfer factors. Hence, it is possible to obtain the filter factors of an nmth-order low-pass filter. Subsequently, the number of cascaded stages of the nmth-order low-pass filter obtained thus is increased one by one. Then, the number of cascaded stages is increased until a decreasing cut-off frequency exceeds the target cut-off frequency again (FIG. 18C).

Similarly transfer filter factors are generated and the filters of an interim product using the transfer filter factors are cascaded in a repeated manner based on the filter factors obtained by the cascade connection. Hence, it is possible to reduce an error between an obtained cut-off frequency and the target cut-off frequency, achieving final filter factors.

With such a method of finely adjusting a frequency, a low-pass filter or high-pass filter having a given cut-off frequency as a property can be designed by an extremely simple operation.

The method for the digital filter and filter design in the present embodiment can be realized any one of a hardware structure, DSP, and software. For example, when the method is realized by software, the digital filter and filter designing apparatus of the present embodiment are actually constituted of the CPU or MPU, RAM, ROM, and so forth and are realized by operating programs stored in the RAM and ROM.

Therefore, a program for operating a computer to perform the functions of the present embodiment is recorded in a recording medium such as a CD-ROM and the computer is caused to read the program, so that the method is realized. A recording medium for recording the program includes a flexible disk, a hard disk, a magnetic tape, an optical disk, a magneto-optical disk, a DVD, and a non-volatile memory card in addition to a CD-ROM. Further, the programs may be downloaded to the computer via a network such as the Internet.

Such a program is included in the present embodiment of the present invention not only when the computer executes the supplied program so as to realize the functions of the present embodiment but also when the functions of the embodiment are realized by the computer in cooperation with an OS (operating system) operating in the computer or another application software and so on and when the processing of the supplied program is entirely or partly performed by a feature expansion board and a feature expansion unit and realizes the functions of the present embodiment.

Further, in the above-described embodiment, {−1, 0, 9, 16, 9, 0, −1} was used as a sequence of filter factors for the basic low-pass filter and {1, 0, −9, 16, −9, 0, 1} was used as a sequence of filter factors for the basic high-pass filter. Other sequences may be used as filter factors as long as the conditions described in the present embodiment are satisfied.

Moreover, the embodiment described, as an example of complementary transfer filters, the following case: when the corresponding factors of filter factor values before and after transfer are added to each other, the addition result of the medians of the sequences is 1 and the other addition results are 0. The addition result of factor values may be 1 in total. For example, the following case is applicable: the addition result of medians is 0.5 and the addition results of values on both sides of the medians are each 0.25.

In a method for obtaining transfer filter factors satisfying such conditions, the median of the sequence of basic filter factors is subtracted from 0.5 and values on both sides of the median are subtracted from 0.25. The signs of the other values are reversed while absolute values caused to remain the same.

Additionally, the above-described embodiment just described one example and the present invention is not limited to the embodiment. That is, cascade connection of filters, conversion of a clock rate, and transfer of filter factors are arbitrarily combined and applied, so that an FIR digital filter having desired frequency characteristics can be designed with ease.

Additionally, the embodiment just described one example of embodying the present invention and thus the technical scope of the present invention should not be interpreted in a limited manner. That is, the present invention may be embodied in various forms without departing from the spirit or main characteristics of the invention.

As described above, according to the present invention, it is possible to design an FIR digital filter having desired frequency characteristics with great ease.

INDUSTRIAL APPLICABILITY

The present invention is effective for readily designing an FIR digital filter having desired frequency characteristics.

The invention claimed is:

1. A digital filter, comprising a tapped delay line made up of a plurality of delay units, the digital filter multiplying signals of taps by given filter factors and then performing addition and output,
the filter factors have a symmetrical sequence and values are set so that a sum of the sequence is zero and a sum of every other terms is equal to a sum of the other every other terms with opposite signs.

2. A digital filter according to claim 1, wherein the sequence of filter factors comprises ratios of 1, 0, −9, 16, −9, 0, and 1.

3. A cascaded digital filter, comprising:
plural digital filters of claim 2 cascaded in a plurality of stages.

4. A digital filter, comprising a tapped delay line made up of a plurality of delay units, the digital filter multiplying signals of taps by given filter factors and then performing addition and output,
the filter is designed based on first filter factors having a symmetrical sequence in which values are set so that a sum is not zero and a sum of every other terms is equal to a sum of the other every other terms with the same signs, and second filter factors are provided as filter factors for the signals of the taps, the second filter factors being obtained by reversing signs of values other than a median of the sequence of the first filter factors.

5. The digital filter according to claim 4, wherein the first filter factors comprise a sequence obtained by cascading a basic filter in one or more stages, the basic filter comprising, as filter factors, a sequence comprising ratios of −1, 0, 9, 16, 9, 0, and −1.

6. A digital filter, comprising a tapped delay line made up of a plurality of delay units, the digital filter multiplying signals of taps by given filter factors and then performing addition and output,
the filter is designed based on first filter factors having a symmetrical sequence in which values are set so that a sum is not zero and a sum of every other terms is equal to a sum of the other every other terms with the same signs, and second filter factors are provided as filter factors for the signals of the taps, the second filter factors being obtained by reversing signs of values other than a median of the sequence of the first filter factors and subtracting the median of the sequence from a reference value.

7. The digital filter according to claim 6, the first filter factors comprising a sequence obtained by cascading a basic filter in one or more stages, the basic filter comprising, as filter factors, a sequence comprising ratios of −1, 0, 9, 16, 9, 0, and −1.

8. A digital filter, comprising a tapped delay line made up of a plurality of delay units, the digital filter multiplying signals of taps by given filter factors and then performing addition and output,
the filter is designed based on second filter factors having a symmetrical sequence in which values are set so that a sum is zero and a sum of every other terms is equal to a sum of the other every other terms with opposite signs, and first filter factors are provided as filter factors for the signals of the taps, the first filter factors being obtained by reversing signs of values other than a median of the sequence of the second filter factors.

9. The digital filter according to claim 8, the second filter factors comprising a sequence obtained by cascading a basic filter in one or more stages, the basic filter comprising, as filter factors, a sequence comprising ratios of 1, 0, −9, 16, −9, 0, and 1.

10. A digital filter, comprising a tapped delay line made up of a plurality of delay units, the digital filter multiplying signals of taps by given filter factors and then performing addition and output,
the filter is designed based on second filter factors having a symmetrical sequence in which values are set so that a sum is zero and a sum of every other terms is equal to a sum of the other every other terms with opposite signs, and first filter factors are provided as filter factors for the signals of the taps, the first filter factors being obtained by reversing signs of values other than a median of the sequence of the second filter factors and subtracting the median of the sequence from a reference value.

11. The digital filter according to claim 10, the second filter factors comprising a sequence obtained by cascading a basic filter in one or more stages, the basic filter comprising, as filter factors, a sequence composed of ratios of 1, 0, −9, 16, −9, 0, and 1.

12. A digital filter, comprising a tapped delay line made up of a plurality of delay units, the digital filter multiplying signals of taps by given filter factors and then performing addition and output,
the filter is designed based on second filter factors having a symmetrical sequence in which values are set so that a sum is zero and a sum of every other terms is equal to a sum of the other every other terms with opposite signs, and first filter factors are provided as filter factors for the signals of the taps, the first filter factors having a sequence in which values are set so that sums of the first filter factors and the second filter factors serve as reference values.

13. A digital filter, comprising a tapped delay line made up of a plurality of delay units, the digital filter multiplying signals of taps by given filter factors and then performing addition and output,
the filter is designed based on first filter factors having a symmetrical sequence in which values are set so that a sum is not zero and a sum of every other terms is equal to a sum of the other every other terms with the same signs, and second filter factors are provided as filter factors for the signals of the taps, the second filter factors being obtained by converting the sequence of the first filter factors and setting values so that a sum of the converted sequence is zero and a sum of every other terms is equal to a sum of the other every other terms with opposite signs in the converted sequence.

14. A digital filter comprising a tapped delay line made up of a plurality of delay units, the digital filter multiplying signals of taps by given filter factors and then performing addition and output,
the filter is designed based on second filter factors having a symmetrical sequence in which values are set so that a sum is zero and a sum of every other terms is equal to a sum of the other every other terms with opposite signs, and first filter factors are provided as filter factors for the signals of the taps, the first filter factors being obtained by converting the sequence of the second filter factors and setting values so that a sum of the converted sequence is not zero and a sum of every other terms is equal to a sum of the other every other terms with the same signs in the converted sequence.

* * * * *